(12) United States Patent
Moon

(10) Patent No.: US 6,346,763 B1
(45) Date of Patent: Feb. 12, 2002

(54) HIGH OUTPUT STACKED PIEZOELECTRIC TRANSFORMER

(75) Inventor: Yangho Moon, Kyungki-do (KR)

(73) Assignee: Samsung Electro-Mechanics Co., Ltd., Kyungki-do (KR)

( * ) Notice: Subject to any disclaimer, the term of this patent is extended or adjusted under 35 U.S.C. 154(b) by 0 days.

(21) Appl. No.: 09/602,510

(22) Filed: Jun. 23, 2000

(30) Foreign Application Priority Data

Jul. 13, 1999 (KR) ............................................ 99-28258

(51) Int. Cl.$^7$ ............................................. H01L 41/04
(52) U.S. Cl. ....................................... 310/359; 310/364
(58) Field of Search ............................... 310/359, 364, 310/369, 354, 344

(56) References Cited

U.S. PATENT DOCUMENTS

| | | | | |
|---|---|---|---|---|
| 2,976,501 A | * | 3/1961 | Mattait ........................ | 310/359 |
| 3,250,017 A | * | 5/1966 | Bartels ........................ | 310/359 |
| 3,764,848 A | * | 10/1973 | Berlincourt ................... | 310/359 |
| 6,008,565 A | | 12/1999 | Inoi et al. | |
| 6,065,196 A | | 5/2000 | Inoi et al. | |

* cited by examiner

Primary Examiner—Burton S. Mullins
Assistant Examiner—Karen Addison
(74) Attorney, Agent, or Firm—Renner, Otto, Boisselle & Sklar, LLP

(57) ABSTRACT

A high output stacked type piezoelectric transformer is disclosed, in which the capacitance values of input and output are increased, and the oscillation speed is lowered, to realize a high output, and to lower the heat release temperature. The high output stacked piezoelectric transformer includes a first piezoelectric element and a first input electrode formed upon the first piezoelectric element. A first output electrode is provided electrically isolated from the first input electrode. A ground electrode is formed on the bottom of the first piezoelectric element, and a second piezoelectric element is formed under the ground electrode. A second input electrode is formed on the bottom of the second piezoelectric element, and a second output electrode is electrically isolated from the second input electrode.

17 Claims, 14 Drawing Sheets

OP

→ : POLARIZATION DIRECTION

HIGH OUTPUT STACKED PIEZOELECTRIC TRANSFORMER

BACKGROUND OF THE INVENTION

1. Field of the Invention

The present invention relates to a piezoelectric transformer which converts a primary voltage to a secondary voltage by utilizing a deformation of a piezoelectric element during a supply of a voltage. Particularly, the present invention relates to a high output stacked type piezoelectric transformer in which the capacitance values of input and output are increased to realize a high output, and to lower the heat release temperature.

2. Description of the Prior Art

Generally, the basic principle of the piezoelectric transformer is as follows. That is, if a voltage is impressed on a part of the body of a piezoelectric element, then, a deformation occurs on the part, and then, the deformation propagates to other parts. This phenomenon is utilized in the piezoelectric transformer. This piezoelectric transformer is classified into various kinds depending on the shapes and oscillation modes of the input and output sides. Among them, a ring-dot type piezoelectric transformer which is considered as a ballast piezoelectric transformer is illustrated in FIGS 1a and 1b.

FIG. 1a is a plan view of the conventional ring-dot type piezoelectric transformer. FIG. 1b is a sectional view of the conventional ring-dot type piezoelectric transformer. As shown in FIG. 1a, the ring-dot type piezoelectric transformer is divided into a ring region and a dot region by an annular open region OP. Referring to FIG. 1b, the ring-dot type piezoelectric transformer includes: a piezoelectric element 11; an input electrode INE formed on the top of the piezoelectric element 11, for being connected to an input terminal IN receiving a primary voltage; an output electrode OUTE electrically isolated from the input electrode INE by the open region OP, and connected to an output terminal OUT, the output terminal OUT receiving a secondary voltage; and a ground electrode GE formed on the bottom of the piezoelectric element 11 and connected to the ground. In the above, the dot portion may become the input electrode INE, and the ring portion may become the output electrode OUTE. On the other hand, the ring portion may become the input electrode INE, and the dot portion may become the output electrode OUTE.

In the conventional ring-dot type piezoelectric transformer, if an input voltage of the resonance frequency is supplied to the input electrode INE of FIG. 1b, i.e., to the dot of FIG. 1a, then contraction-expansion oscillations occur in the planar direction of FIG. 1b (in the direction of the arrow mark). Under this condition, contractions-expansions occur in the thickness direction in the opposite manner, with the result that the output electrode OUTE outputs a voltage owing to the piezoelectric effect.

However, in the conventional ring-dot type piezoelectric transformer, the capacitances of the input and output sides are very small, and therefore, it is not suitable for using it as a high output transformer. Even if it is used as a high output transformer, if the oscillation speed increase above a certain level, then the heat release temperature is steeply raised, with the result that the transformer departs from the allowance value.

SUMMARY OF THE INVENTION

The present invention is intended to overcome the above described disadvantages of the conventional technique.

Therefore it is an object of the present invention to provide a high output stacked type piezoelectric transformer in which the capacitance values of input and output are increased to realize a high output, and to lower the heat release temperature.

In achieving the above object, the high output stacked piezoelectric transformer according to the present invention includes: a first piezoelectric element; a first input electrode formed upon the first piezoelectric element; a first output electrode electrically isolated from the first input electrode; a ground electrode formed on the bottom of the first piezoelectric element; a second piezoelectric element formed under the ground electrode; a second input electrode formed on the bottom of the second piezoelectric element; and a second output electrode electrically isolated from the second input electrode.

BRIEF DESCRIPTION OF THE DRAWINGS

The above object and other advantages of the present invention will become more apparent by describing in detail the preferred embodiment of the present invention with reference to the attached drawings in which:

FIG. 9b is a coupled-state perspective view of the stacked ring-dot type piezoelectric transformer of FIG. 9a;

FIG. 12 illustrates a fifth embodiment of the stacked ring-dot type piezoelectric transformer according to the present invention, in which.

DETAILED DESCRIPTION OF THE PREFERRED EMBODIMENTS

Figure 1A:
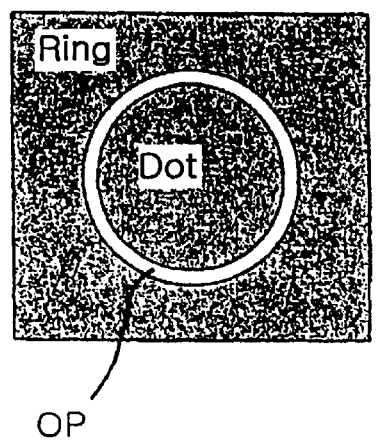
FIG. 1a is a plan view of the conventional ring-dot type piezoelectric transformer.

The high output stacked piezoelectric transformer according to the present invention will be described in detail referring to the attached drawings. In the drawings, the elements which have the same constitutions and functions will be assigned with the same reference codes.

Figure 2:
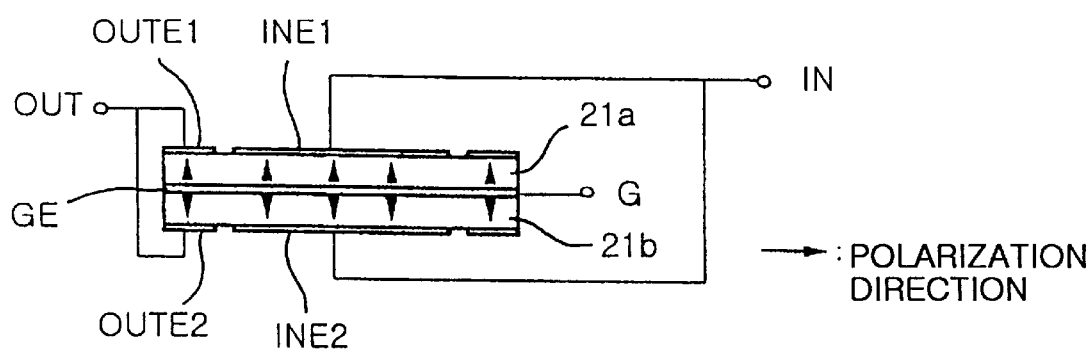
FIG. 2 is a sectional view of a first embodiment of the stacked ring-dot type piezoelectric transformer according to the present invention.

FIG. 2 is a sectional view of a first embodiment of the stacked ring-dot type piezoelectric transformer according to the present invention. Referring to FIG. 2, a first embodiment of the stacked ring-dot type piezoelectric transformer according to the present invention includes: a first piezoelectric element 21a; a first input electrode INE1 formed upon the first piezoelectric element 21a; a first output electrode OUTE1 electrically isolated from the first input electrode INE1, and formed on the same plane as that of the first input electrode INE1; a ground electrode GE formed on a bottom of the first piezoelectric element 21a; a second piezoelectric element 21b formed under the ground electrode GE; a second input electrode INE2 formed on a bottom of the second piezoelectric element 21b; and a second output electrode OUTE2 electrically isolated from the second input electrode and formed on the same plane as that of the second input electrode INE2. Here, the arrow mark indicates the polarization direction, and this is applied in the same manner throughout all the drawings.

In FIG. 2, the first and second input electrodes INE1 and INE2 have a circular form, and are formed at the centers of the first and second piezoelectric elements 21a and 21b. The first and second output electrodes OUTE1 and OUTE2 are formed around the input electrodes INE1 and INE2, and the former are electrically isolated from the latter by an annular open region OP. Alternatively, the first and second output electrodes OUTE1 and OUTE2 may have a circular formed, being formed at the centers of the first and second piezoelectric elements 21a and 21b, and the first and second input electrodes INE1 and INE2 may be formed around the first and second output electrodes OUTE1 and OUTE2, being electrically isolated from the latter by the annular open region OP.

Figure 3:
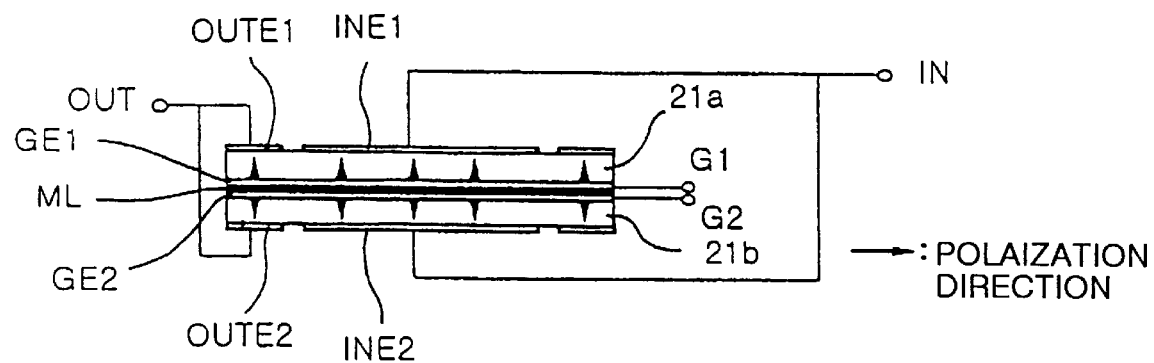
FIG. 3 illustrates a modified example of FIG. 2.

FIG. 3 illustrates a modified example of FIG. 2. Referring to FIG. 3, to the first embodiment of the piezoelectric transformer, modifications are carried out as follows. That is, the ground electrode which is disposed between the first piezoelectric element 21a and the second piezoelectric element 21b is divided into two layers by interposing an insulating layer ML. Thus a ground electrode GE1 is formed under the first piezoelectric element 21a, and another ground electrode GE2 is formed upon the second piezoelectric element 21b.

Figure 4:
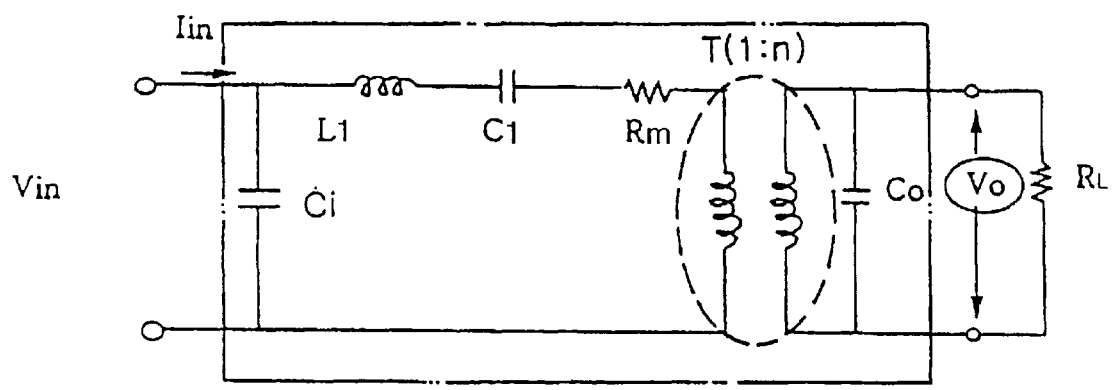
FIG. 4 is an equivalent circuit for the stacked ring-dot type piezoelectric transformer according to the present invention.

FIG. 4 is an equivalent circuit for the stacked ring-dot type piezoelectric transformer according to the present invention (that is, of FIGS. 2 and 3). Referring to FIG. 4, the stacked ring-dot type piezoelectric transformer according to the present invention includes: an input capacitor Ci, an inductor L1, a capacitor C1, a resistor Rm, a transformer T, and an output capacitor Co in an equivalent form. The Resistor Rm, the inductor L and the capacitor C conform to the values of the oscillation mode, the structure and the physical properties of the piezoelectric element. The input capacitor Ci and the output capacitor Co have values which are decided by the area of the electrode faces and by the thicknesses of the piezoelectric elements. Under this condition, the capacitance C of the input/output capacitors Ci and Co of the piezoelectric transformer according to the present invention can be expressed by $C = a \times N \times (A/t)$, where N is the number of the stacked layers, A is the area of the electrode face, and t is the thickness of the piezoelectric element.

Accordingly, in the stacked ring-dot type piezoelectric transformer according to the present invention, the input and output side capacitances can be easily adjusted by varying the number of the stacked layers. As a result, the responsive design to the variations of the input voltage and the output load becomes easy. The equivalent circuit of FIG. 4 is applicable to the other embodiments of the present invention.

Figure 1B:
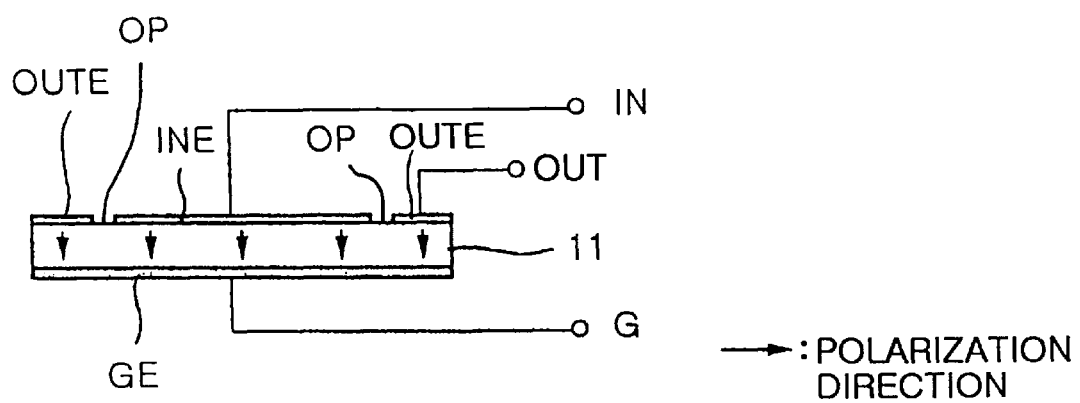
FIG. 1b is a sectional view of the conventional ring-dot type piezoelectric transformer.

The element values of the conventional ring-dot type piezoelectric transformer of FIG. 1 can be compared with those of the stacked ring-dot type piezoelectric transformer of FIGS. 2 and 3. A summarization of the comparison is shown in Table 1 below.

TABLE 1

|  | n — | Ci nF | Co nF | L1 mH | C1 pF | Rm — |
|---|---|---|---|---|---|---|
| Conventional | 0.42 | 0.591 | 1.87 | 85.2 | 52.7 | — |
| Inventive | 0.42 | 1.18 | 3.74 | 41.2 | 111 | — |

As can be seen in Table 1 above, the capacitances of the input capacitor Ci and the output capacitor Co have increased in the stacked piezoelectric transformer of the present invention, compared with those of the conventional single layer piezoelectric transformer. The capacitances of the piezoelectric transformer according to the present invention are larger by about twice those of the single layer conventional piezoelectric transformer. Therefore, the output power can be increased by increasing the input power, and therefore, the piezoelectric transformer according to the present invention becomes suitable for use as a high output power transformer. In the case where it is used as a high output power transformer, the oscillation speed does not increase compared with the conventional one, and therefore, the heat release temperature is not steeply raised. Further, the capacitor of the output side makes it possible to realize an impedance matching with the load by adjusting the area of the ring.

Meanwhile, in the ring-dot type piezoelectric transformer, generally if the oscillation speed increases, then the heat release amount increases. Under this condition, based on a 28 W of the output power of the ring-dot type piezoelectric transformer, the oscillation speed of the conventional ring-dot type piezoelectric transformer is 0.33 m/sec, whereas the oscillation speed of the stacked ring-dot type piezoelectric transformer according to the present invention is 0.24 m/sec. Thus, the oscillation speed in the present invention is decreased by about 27% compared with the conventional one, and so much the heat release temperature is decreased, with the result that the piezoelectric transformer of the present invention can be used as a high output transformer.

Figure 5:
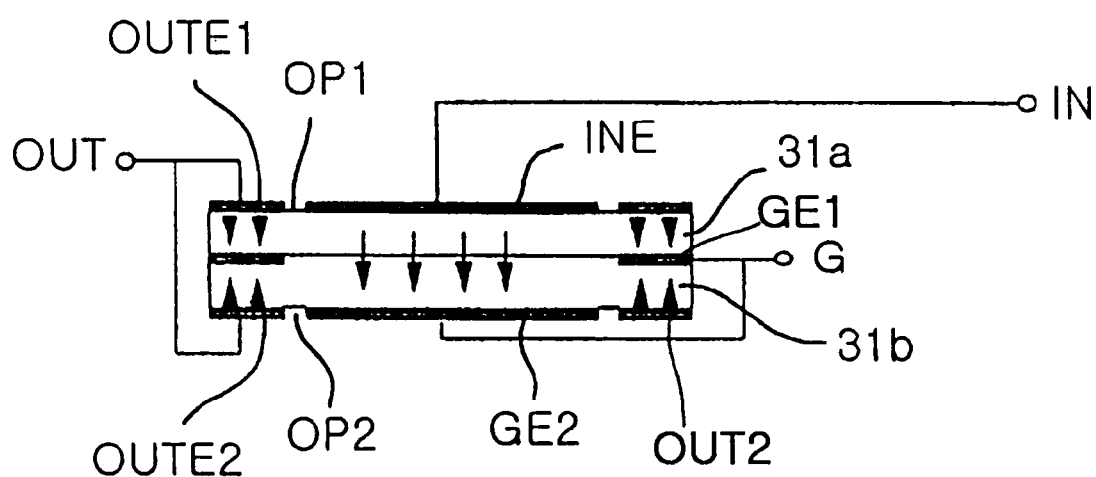
FIG. 5 is a sectional view of a second embodiment of the stacked ring-dot type piezoelectric transformer according to the present invention.

FIG. 5 is a sectional view of a second embodiment of the stacked ring-dot type piezoelectric transformer according to the present invention. Referring to FIG. 5, a second embodiment of the stacked ring-dot type piezoelectric transformer according to the present invention includes: a first piezoelectric element 31a; an input electrode INE formed upon the first piezoelectric element 31a; a first output electrode OUTE1 electrically isolated from the input electrode INE, and formed on the same plane as that of the input electrode INE; a first ground electrode GE1 formed on a bottom of the first piezoelectric element 31a and facingly to the first output electrode OUTE1; a second piezoelectric element 31b stacked under the first piezoelectric element 31a (on which the first ground electrode GE1 is formed); a second output electrode OUTE2 formed on a bottom of the second piezoelectric element 31b and facingly to the first ground electrode GE1; and a second ground electrode GE2 electrically isolated from the second output electrode OUTE2 and formed on the same plane as that of the second output electrode OUTE2, and facingly the input electrode INE.

The first ground electrode GE1 is formed around the circular portion and between the first and second piezoelectric elements 31a and 31b.

Each of the input electrode INE and the second ground electrode GE2 is formed in a circular form at the center of each of the first and second piezoelectric elements 31a and 31b. The first and second output electrodes OUTE1 and OUTE2 are formed on the same planes as those of the first input electrode INE1 and the second ground electrode GE2, and are electrically isolated from each other by open regions OP1 and OP2.

Figure 6:
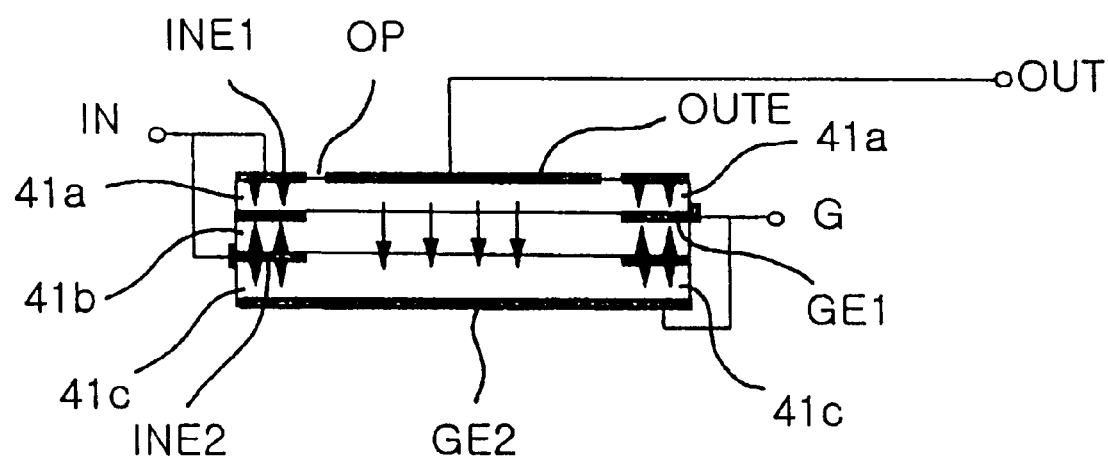
FIG. 6 is a sectional view of a third embodiment of the stacked ring-dot type piezoelectric transformer according to the present invention.
Figure 7:
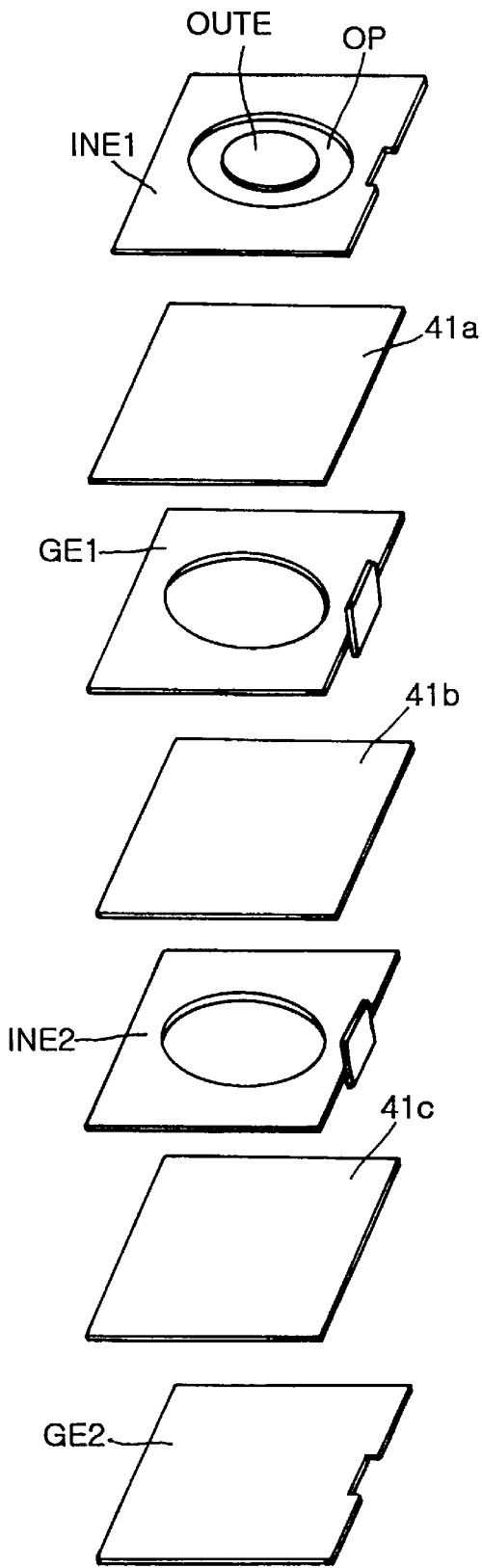
FIG. 7 is an exploded perspective view of the stacked ring-dot type piezoelectric transformer of FIG. 6.

FIG. 6 is a sectional view of a third embodiment of the stacked ring-dot type piezoelectric transformer according to the present invention. FIG. 7 is an exploded perspective view of the stacked ring-dot type piezoelectric transformer of FIG. 6.

Referring to FIGS. 6 and 7, the third embodiment of the stacked ring-dot type piezoelectric transformer according to the present invention includes: a first piezoelectric element 41a; a first input electrode INE1 formed upon the first piezoelectric element 41a and outside an open region OP; an output electrode OUTE electrically isolated from the first input electrode INE1, and formed on the same plane as that of the first input electrode INE1; a first ground electrode GE1 formed on a bottom of the first piezoelectric element 41a and facingly to the first input electrode INE1; a second piezoelectric element 41b stacked under the first piezoelectric element 41a (on which the first ground electrode GE1 is formed); a second input electrode INE2 formed on a bottom of the second piezoelectric element 41b and facingly to the first ground electrode GE1; a third piezoelectric element 41c stacked under the second piezoelectric element 41b (on which the second input electrode INE2 is formed); and a second ground electrode GE2 formed on an entire bottom face of the third piezoelectric element 41c.

The output electrode OUTE is formed in a circular form at the center of the upper face of the first piezoelectric element 41a. The first input electrode INE1 is formed around the output electrode OUTE on the same plane, and is electrically isolated from the latter by the open region OP.

The first ground electrode GE1 is formed around the central circular portion and between the first and second piezoelectric elements 41a and 41b.

The second input electrode INE2 is formed around the central circular portion and between the second and third piezoelectric elements 41b and 41c like the first input electrode INE1 and the first ground electrode GE1. The second ground electrode GE2 is formed on the entire bottom face of the third piezoelectric element 41c.

Figure 8:
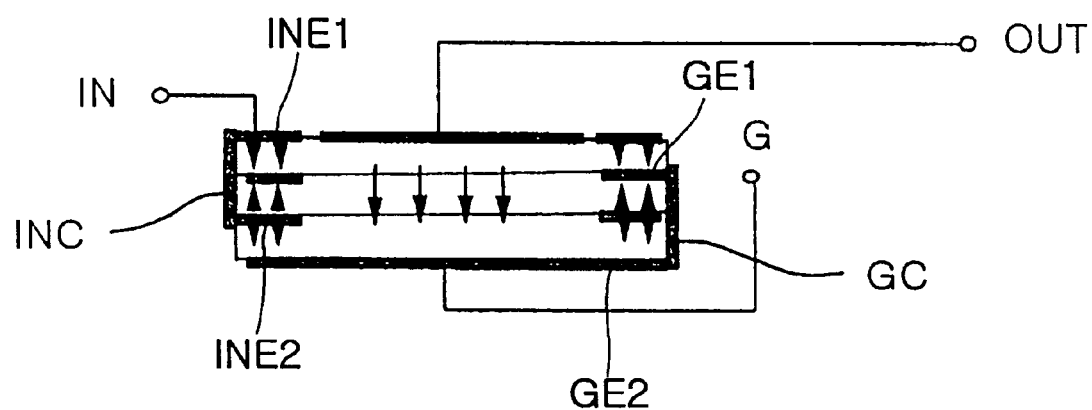
FIG. 8 illustrates a modified example of FIG. 6.

FIG. 8 illustrates a modified example of the stacked piezoelectric transformer of FIG. 6. Referring to FIG. 8, the following elements are added to the third embodiment of the present invention. That is, it further includes: an input electrode connecting part INC for connecting the first input electrode INE1 and the second input electrode INE2 together by means of a pattern; and a ground electrode connecting part GC for connecting the first and second ground electrodes GE1 and GE2 together by means of a pattern.

In the stacked ring-dot type piezoelectric transformers of FIGS. 5, 6 and 8, with an output being assumed to be 28 W, the output capacitance of the piezoelectric transformers has to be about 2104 pF, if an impedance matching is to be realized. Accordingly, if the thickness of the output side is 3.5 mm, then the radius of the dot becomes 15.5 mm ($C = \epsilon A/t = \epsilon \pi r^2 / t = 0.97475E-0.8 * \pi * r^2 / 0.0035$, $r = sqrt(tC/(\epsilon \pi))$). This stacked ring-dot type piezoelectric transformer corresponds to a form in which the impedances of the input side and the output side are lowered.

Figure 9A:
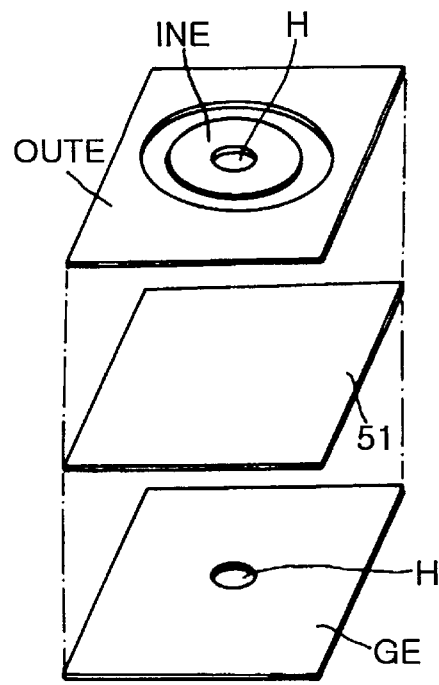
FIG. 9a is an exploded perspective view showing a fourth embodiment of the stacked ring-dot type piezoelectric transformer according to the present invention.
Figure 9B:
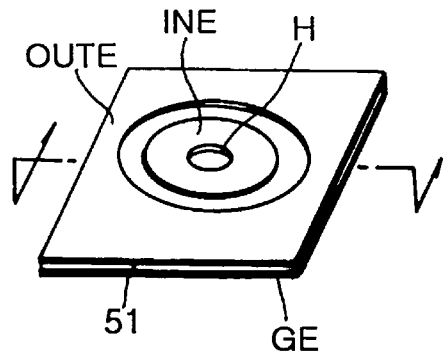
Figure 9C:
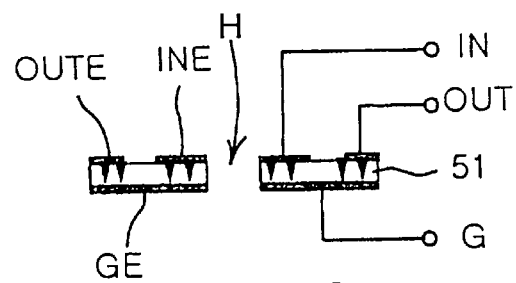
FIG. 9c is a sectional view of FIG. 9b.

FIG. 9a is an exploded perspective view showing a fourth embodiment of the stacked ring-dot type piezoelectric transformer according to the present invention. FIG. 9b is a coupled perspective view of the stacked ring-dot type piezoelectric transformer of FIG. 9a. FIG. 9c is a sectional view of FIG. 9b.

Referring to FIGS. 9a, 9b and 9c, the fourth embodiment of the stacked ring-dot type piezoelectric transformer according to the present invention includes: a piezoelectric element 51; an input electrode INE formed upon the piezoelectric element 51; an output electrode OUTE electrically isolated from the input electrode INE; and a ground electrode GE formed on a bottom of the piezoelectric element 51. The piezoelectric transformer further includes: a through hole H formed through the center of the piezoelectric transformer, for increasing the area of the exposed surface of the transformer as to lower the heat release temperature.

Figure 10:
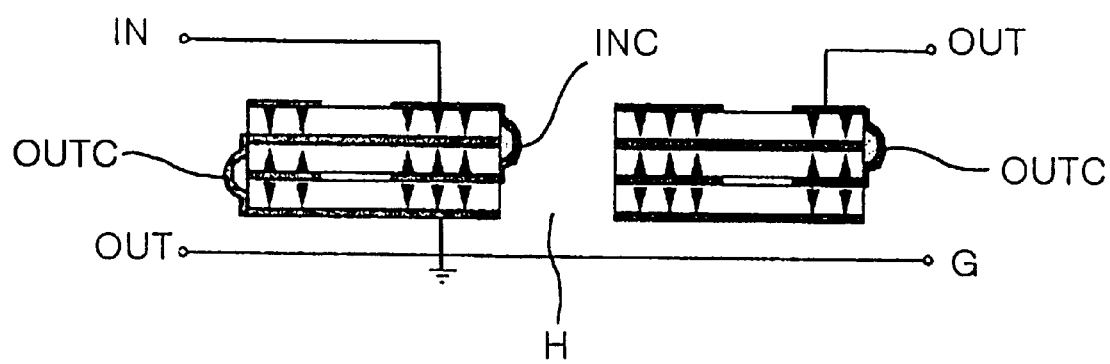
FIG. 10 illustrates a modified example of FIG. 9.

FIG. 10 illustrates a modified example of FIG. 9. Referring to FIG. 10, in this modified example of the fourth embodiment, the stacked ring-dot type piezoelectric transformer can include two or more layers of the piezoelectric elements. Under this condition, the input electrodes, the out electrodes and the ground electrodes can be connected themselves together through connecting parts INC, OUTC and GC.

In the stacked ring-dot type piezoelectric transformers of FIGS. 9 and 10, the input impedance is fitted to the dot size, and the output impedance is fitted to the number of the stacked layers, so that only the impedance of the output side can be lowered.

The resonance frequency and the anti-resonance frequency of the stacked ring-dot type piezoelectric transformer of the present invention are compared with those of the conventional ring-dot type piezoelectric transformer, and the comparison results are shown in Table 2 below.

TABLE 2

| | | Input | | | Output | | |
|---|---|---|---|---|---|---|---|
| | | fr KHZ | fa KHZ | k % | fr KHZ | fa KHZ | k % |
| Analysis | Conventional | 75.131 | 77.460 | 24.3 | 75.131 | 79/161 | 31.5 |
| | Inventive | 74.488 | 76.918 | 24.9 | 74.488 | 78.688 | 32.2 |
| Experiment | Conventional | 75.25 | 78.10 | 26.8 | 75.20 | 79.60 | 32.8 |

In Table 2 above, fr indicates the resonance frequency, fa indicates the anti-resonance frequency, and k indicates oscillation energy/voltage energy. As shown in Table 2 above, the resonance frequency fr and the anti-resonance frequency fa are lowered in the present invention compared with the conventional transformer, while k has slightly increased.

Figure 11:
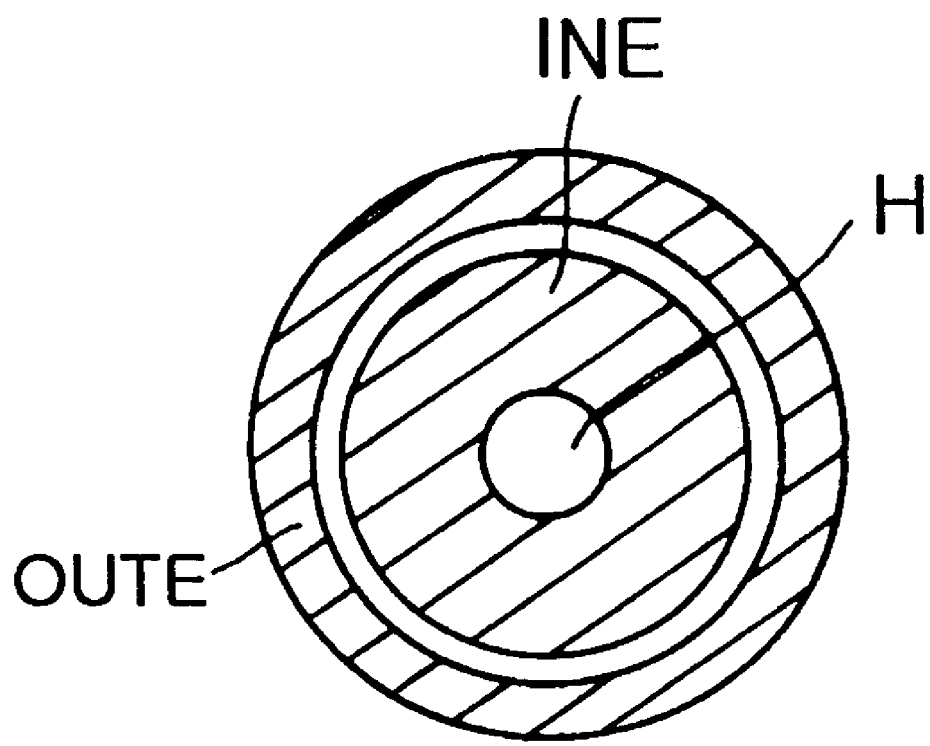
FIG. 11 illustrates another modified example of FIG. 9.

FIG. 11 illustrates another modified example of FIG. 9. Here the first modified example of the fourth embodiment is further modified as follows. That is, the piezoelectric transformer can be made round rather than rectangular.

FIG. 12 illustrates a fifth embodiment of the stacked ring-dot type piezoelectric transformer according to the present invention. As illustrated in FIG. 12, an upper face of a doughnut shaped piezoelectric element 61 is divided into two mutually electrically isolated parts to form an input electrode INE and an output electrode OUTE. A ground electrode GE is formed under the doughnut shaped piezoelectric element 61, thereby forming a stacked ring-dot type piezoelectric transformer.

Figure 12A:
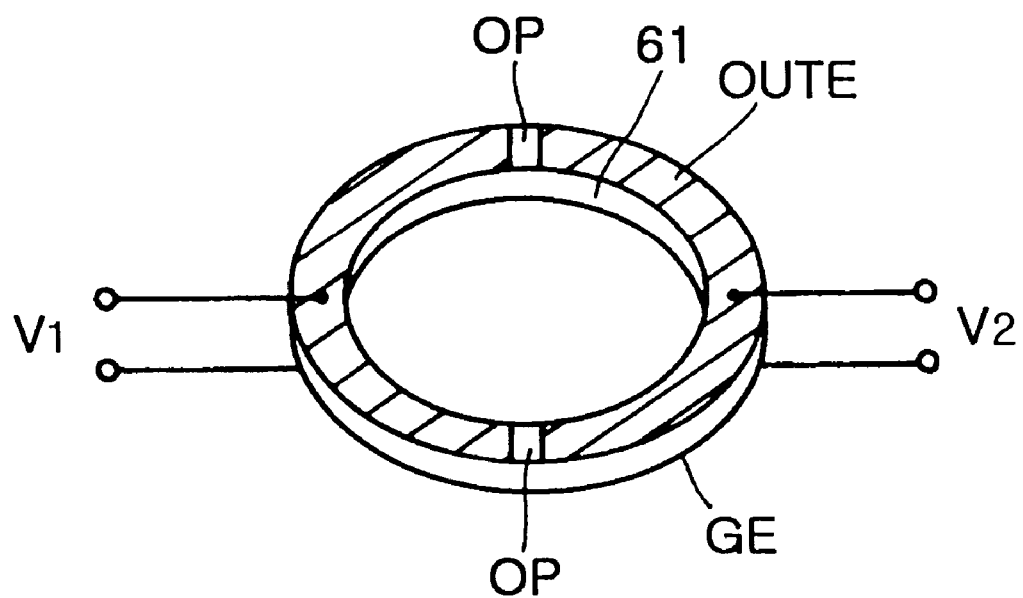
FIG. 12a is a perspective view of the ring type piezoelectric transformer.
Figure 12B:
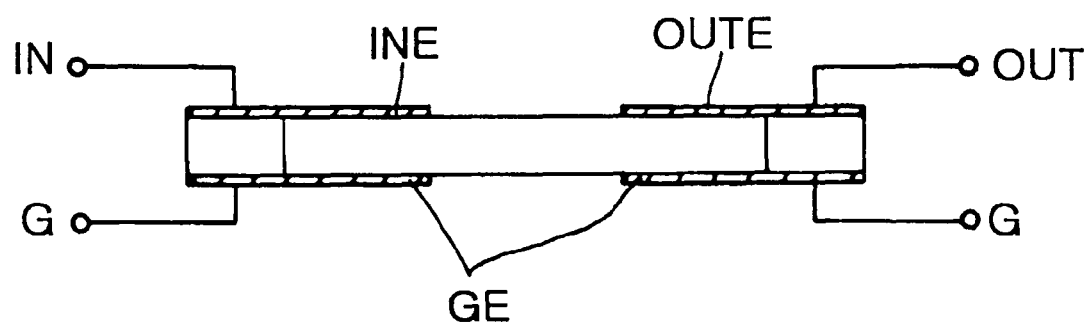
FIG. 12b is a sectional view of a single layer piezoelectric transformer.

FIG. 12a is a perspective view of the ring type piezoelectric transformer. FIG. 12b is a sectional view of a single layer piezoelectric transformer. In this ring type transformer, the exposed surface area is increased, and therefore, the heat release temperature is lowered.

Figure 12C:
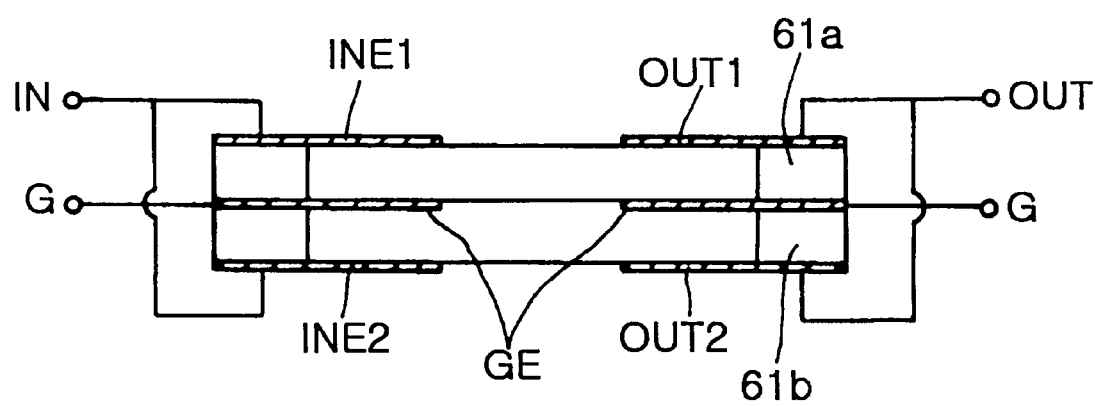
FIG. 12c is a sectional view of a multi-layer piezoelectric transformer.

FIG. 12c is a sectional view of a multi-layer piezoelectric transformer. This stacked ring type piezoelectric transformer according to the present invention includes: a first doughnut shaped piezoelectric element 61a; a first input electrode INE1 occupying a part of an upper face of the first piezoelectric element 61a; a first output electrode OUTE1 occupying another part of the upper face of the first piezoelectric element 61a, and electrically isolated from the first input electrode INE1 by an open region OP; a ground electrode GE formed under the first piezoelectric element 61a; a second piezoelectric element 61b stacked beneath the first piezoelectric element 61a across the ground terminal GE; and second input and output electrodes INE2 and OUTE2 formed under the second piezoelectric element 61b and opposite to the first input and out electrodes INE1 and OUTE1.

Both of the first and second input electrodes INE1 and INE2 are connected to an input terminal IN, and both of the first and second output electrodes OUTE1 and OUTE2 are connected to an output terminal OUT, while the ground electrode GE is connected to a ground terminal G.

According to the present invention as described above, the input capacitance can be increased through stacking, so that the input power can be increased, and that the output capacitance can also be increased. Further, the impedance matching with the load is rendered easier, and thus, the oscillation speed can be lowered, thereby realizing a high output power. Further, the heat release temperature is lowered.

While the conventional ring-dot type piezoelectric transformer is applicable to only the ballast, the stacked ring-dot type piezoelectric transformer of the present invention is applicable even to adaptor and charger, because the input and output capacitances can be adjusted, and consequently because the adjustment between the load and the source becomes easy.

In the above, the present invention was described based on the specific preferred embodiments and the attached drawings, but it should be apparent to those ordinarily skilled in the art that various changes and modifications can be added without departing from the spirit and scope of the present invention which will be defined in the appended claims.

What is claimed is:

1. A high output stacked piezoelectric transformer comprising;
   a first piezoelectric element (21a);
   a first input electrode (INE1) formed upon said first piezoelectric element (21a);
   a first output electrode (OUTE1) electrically isolated from said first input electrode (INE1), and formed on a same plane as that of said first input electrode (INE1);
   a ground electrode (GE) formed on a bottom of said first piezoelectric element (21a);
   a second piezoelectric element (21b) formed under said first piezoelectric element (21a) across said ground electrode (GE);
   a second input electrode (INE2) formed on a bottom of said second piezoelectric element (21b) oppositely to said first input electrode (INE1);
   a second output electrode (OUTE2) electrically isolated from said second input electrode (INE2) and formed on a same plane as that of said second input electrode (INE2),
   wherein each of said first and second output electrodes (OUTE1) and (OUTE2) has a circular shape, and is disposed at a center of each of said first and second piezoelectric elements (21a) and (21b); and
   each of said first and second input electrodes (INE1) and (INE2) is formed around each of said first and second output electrodes (OUTE1) and (OUTE2) electrically isolated from each of them by an open region (OP).

2. A high output stacked piezoelectric transformer comprising;
   a first piezoelectric element (21a);
   a first input electrode (INE1) formed upon said first piezoelectric element (21a);
   a first output electrode (OUTE1) electrically isolated from said first input electrode (INE1), and formed on a same plane as that of said first input electrode (INE1);
   a first ground electrode (GE1) formed on a bottom of said first piezoelectric element (21a);
   an insulating layer (ML) formed on a bottom of said first ground electrode (GE1);
   a second ground electrode (GE2) formed on a bottom of said insulating layer (ML) and electrically isolated from (GE1) by the said insulating layer (ML);
   a second piezoelectric element (21b) formed under said first piezoelectric element (21a) across said second ground electrode (GE2);
   a second input electrode (INE2) formed on a bottom of said second piezoelectric element (21b) oppositely to said first input electrode (INE1); and
   a second output electrode (OUTE2) electrically isolated from said second input electrode (INE2) and formed on a same plane as that of said second input electrode (INE2).

3. A high output stacked piezoelectric transformer comprising:
   a first piezoelectric element (31a);
   an input electrode INE formed upon said first piezoelectric element (31a);
   a first output electrode OUTE1 electrically isolated from said input electrode (INE), and formed on a same plane as that of said input electrode (INE);
   a first ground electrode GE1 formed on a bottom of said first piezoelectric element (31a);
   a second piezoelectric element (31b) formed under said a first piezoelectric element (31a) across said first ground electrode (GE1);
   a second output electrode (OUTE2) formed on a bottom of said second piezoelectric element (31b); and
   a second ground electrode (GE2) electrically isolated from said second output electrode (OUTE2).

4. The high output stacked piezoelectric transformer as claimed in claim 3, wherein said first ground electrode (GE1) is formed around a central circular portion and between said first and second piezoelectric elements (31a) and (31b).

5. The high output stacked piezoelectric transformer as claimed in claim 3, wherein each of said first input electrode INE1 and said second ground electrode (GE2) is formed in a circular form at a center of each of said first and second piezoelectric elements (31a) and (31b); and each of said first and second output electrodes OUTE1 and (OUTE2) is formed electrically isolated from each of said first input electrode (INE1) and said second ground electrode (GE2) by each of annular open regions (OP1) and (OP2).

6. A high output stacked piezoelectric transformer comprising:

a first piezoelectric element (41a);

a first input electrode (INE1) formed upon said first piezoelectric element (41a);

a first output electrode (OUTE1) electrically isolated from said first input electrode (INE1);

a first ground electrode (GE1) formed on a bottom of said first piezoelectric element (41a);

a second piezoelectric element (41b) formed under said first ground electrode (GE1);

a second input electrode (INE2) formed on a bottom of said second piezoelectric element (41b);

a third piezoelectric element (41c) formed under said second input electrode INE2; and a second ground electrode (GE2) formed on a bottom face of said third piezoelectric element (41c).

7. The high output stacked piezoelectric transformer as claimed in claim 6, wherein said first output electrode (OUTE1) is formed in a circular shape at a center of said first piezoelectric element (41a); and said first input electrode INE1 is formed electrically isolated from said first output electrode (OUTE1) by an annular open region (OP).

8. The high output stacked piezoelectric transformer as claimed in claim 6, wherein said first ground electrode (GE1) is formed around a central circular portion and between said first and second piezoelectric elements (41a) and (41b).

9. The high output stacked piezoelectric transformer as claimed in claim 6, wherein said second input electrode (INE2) is formed around a central circular portion and between said second and third piezoelectric elements (41b) and (41c).

10. The high output stacked piezoelectric transformer as claimed in claim 6, further comprising an input electrode connecting part INC for connecting said first and second input electrodes (INE1) and (INE2) together by a pattern.

11. The high output stacked piezoelectric transformer as claimed in claim 6, further comprising a ground electrode connecting part (GC) for connecting said first and second ground electrodes (GE1) and (GE2) together by a pattern.

12. A high output stacked piezoelectric transformer comprising:

a piezoelectric element (51);

an input electrode INE formed upon said piezoelectric element (51);

an output electrode (OUTE) electrically isolated from said input electrode (INE);

a ground electrode (GE) formed on a bottom of said piezoelectric element (51); and a through hole (H) formed through a center of said piezoelectric transformer.

13. The high output stacked piezoelectric transformer as claimed in claim 12, wherein said piezoelectric transformer has two or more layers of said piezoelectric element.

14. The high output stacked piezoelectric transformer as claimed in claim 12, wherein said piezoelectric transformer is disc-shaped.

15. A high output stacked piezoelectric transformer comprising:

a doughnut-shaped piezoelectric element (61);

an input electrode INE occupying a part of an upper face of said piezoelectric element (61);

an output electrode OUTE occupying another part of the upper face of said piezoelectric element (61), and electrically isolated from said input electrode (INE); and a ground electrode (GE) formed beneath said piezoelectric element 61.

16. The high output stacked piezoelectric transformer as claimed in claim 15, wherein said piezoelectric transformer has two or more layers of said piezoelectric element.

17. The high output stacked piezoelectric transformer as claimed in claim 16, wherein two or more input electrodes (INE), output electrodes OUTE and ground electrodes are respectively connected themselves together by electrode connecting parts (INC), (OUTC) and (GC).

* * * * *